(12) United States Patent
Brunner et al.

(10) Patent No.: US 9,001,523 B2
(45) Date of Patent: Apr. 7, 2015

(54) CARRIER DEVICE, ARRANGEMENT COMPRISING SUCH A CARRIER DEVICE, AND METHOD FOR PATTERNING A LAYER STACK COMPRISING AT LEAST ONE CERAMIC LAYER

(75) Inventors: Sebastian Brunner, Graz (AT); Gerhard Fuchs, Steinerkirchen (AT); Annette Fischer, Lannach (AT); Manfred Fischer, Lannach (AT); Christian Faistauer, Frauental (AT); Guenter Pudmich, Koeflach (AT); Edmund Payr, Graz (AT); Stefan Leopold Hatzl, Graz (AT)

(73) Assignee: Epcos AG, Munich (DE)

( * ) Notice: Subject to any disclaimer, the term of this patent is extended or adjusted under 35 U.S.C. 154(b) by 376 days.

(21) Appl. No.: 13/391,974

(22) PCT Filed: Aug. 11, 2010

(86) PCT No.: PCT/EP2010/061708
§ 371 (c)(1),
(2), (4) Date: Apr. 20, 2012

(87) PCT Pub. No.: WO2011/023556
PCT Pub. Date: Mar. 3, 2011

(65) Prior Publication Data
US 2012/0218728 A1    Aug. 30, 2012

(30) Foreign Application Priority Data
Aug. 24, 2009 (DE) .......................... 10 2009 038 674

(51) Int. Cl.
*H05K 7/00* (2006.01)
*H01L 21/48* (2006.01)
(Continued)

(52) U.S. Cl.
CPC ............ *H01L 21/4846* (2013.01); *H01L 23/15* (2013.01); *H01L 23/49894* (2013.01); *H01L 2924/09701* (2013.01); *H01L 2224/16225* (2013.01); *H01L 2924/1461* (2013.01)

(58) Field of Classification Search
CPC ................ H01L 21/4846; H01L 23/15; H01L 23/49894
USPC .......................................... 361/783; 174/257
See application file for complete search history.

(56) References Cited

U.S. PATENT DOCUMENTS 4,081,601 A * 3/1978 Dinella et al. ................ 174/257
4,767,672 A   8/1988 Fujinaka et al.
(Continued)

FOREIGN PATENT DOCUMENTS

DE        691 33 409 T2   12/2004
DE  10 2005 036 646 B4    4/2008
(Continued)

*Primary Examiner* — David M Sinclair
*Assistant Examiner* — Robert Brown
(74) *Attorney, Agent, or Firm* — Slater & Matsil, L.L.P.

(57) ABSTRACT

A method for patterning a layer stack with at least one ceramic layer includes providing the ceramic layer, which has at least one plated-through hole. An electrically conductive layer is applied above the ceramic layer, such that the electrically conductive layer is electrically coupled to the at least one plated-through hole. A further layer is deposited onto the electrically conductive layer in the region of the at least one plated-through hole, wherein the further layer includes nickel. The electrically conductive layer is removed outside the region of the at least one plated-through hole. A carrier device patterned in this way can be electrically and mechanically coupled to an electronic component.

13 Claims, 6 Drawing Sheets

(51) Int. Cl.
*H01L 23/15* (2006.01)
*H01L 23/498* (2006.01)

(56) References Cited

U.S. PATENT DOCUMENTS

| | | | |
|---|---|---|---|
| 5,207,865 A | 5/1993 | Satoh | |
| 6,041,495 A * | 3/2000 | Yoon et al. | 29/841 |
| 6,249,053 B1 | 6/2001 | Nakata et al. | |
| 6,517,893 B2 * | 2/2003 | Abys et al. | 29/840 |
| 6,726,847 B2 * | 4/2004 | Mirkin et al. | 216/90 |
| 6,759,318 B1 * | 7/2004 | Chang | 438/612 |
| 7,122,894 B2 * | 10/2006 | Sugimoto et al. | 257/737 |
| 7,304,249 B2 * | 12/2007 | Lee et al. | 174/267 |
| 8,502,391 B2 * | 8/2013 | Park et al. | 257/774 |
| 8,759,986 B2 * | 6/2014 | Lee et al. | 257/779 |
| 2001/0042637 A1 * | 11/2001 | Hirose et al. | 174/255 |
| 2002/0125214 A1 * | 9/2002 | Mirkin et al. | 216/90 |
| 2005/0150683 A1 | 7/2005 | Farnworth et al. | |
| 2006/0019467 A1 * | 1/2006 | Lee et al. | 438/462 |
| 2007/0224400 A1 * | 9/2007 | Meguro et al. | 428/209 |
| 2008/0148559 A1 * | 6/2008 | Nickerson et al. | 29/832 |
| 2009/0296360 A1 * | 12/2009 | Doblar et al. | 361/767 |
| 2010/0018049 A1 * | 1/2010 | Sakamoto et al. | 29/834 |
| 2010/0047971 A1 * | 2/2010 | Hua | 438/122 |
| 2010/0071940 A1 * | 3/2010 | Ejiri et al. | 174/257 |
| 2010/0078213 A1 * | 4/2010 | Furutani et al. | 174/266 |
| 2010/0164079 A1 * | 7/2010 | Dekker et al. | 257/676 |
| 2011/0121452 A1 * | 5/2011 | Jang et al. | 257/737 |

FOREIGN PATENT DOCUMENTS

| | | |
|---|---|---|
| EP | 0 276 004 A2 | 7/1988 |
| EP | 0 450 381 B1 | 8/2004 |
| EP | 1 274 125 A2 | 1/2006 |
| JP | 05243699 A | 9/1993 |
| JP | 2001-135922 A | 5/2001 |
| JP | 2005191091 A | 7/2005 |
| JP | 2005235982 A | 9/2005 |
| JP | 2007-250564 A | 9/2007 |
| JP | 2008-091874 A | 4/2008 |
| JP | 2008164577 A | 7/2008 |
| JP | 2008227222 A | 9/2008 |
| WO | 2007063692 A1 | 6/2007 |

* cited by examiner

CARRIER DEVICE, ARRANGEMENT COMPRISING SUCH A CARRIER DEVICE, AND METHOD FOR PATTERNING A LAYER STACK COMPRISING AT LEAST ONE CERAMIC LAYER

This patent application is a national phase filing under section 371 of PCT/EP2010/061708, filed Aug. 11, 2010, which claims the priority of German patent application 10 2009 038 674.2, filed Aug. 24, 2009, each of which is incorporated herein by reference in its entirety.

TECHNICAL FIELD

The invention relates to a carrier device comprising a ceramic layer, and to an arrangement comprising such a carrier device. The invention additionally relates to a method for patterning a layer stack comprising at least one ceramic layer.

BACKGROUND

In the case of ceramic carriers for electronic components, contact locations can be applied to the carriers by means of a screen printing method. For this purpose, the material of the contact locations is applied to the carriers via a screen printing mask. This method can only be used to a specific lower limit with regard to the distances between the contact locations.

SUMMARY OF THE INVENTION

A method can be used for patterning a layer stack comprising at least one ceramic layer, a carrier device, and an arrangement comprising such a carrier device, in order to pattern ceramic carrier devices cost-effectively and as simply as possible.

A method for patterning a layer stack comprising at least one ceramic layer comprises providing the ceramic layer, which comprises at least one plated-through hole. An electrically conductive layer is applied above the ceramic layer, such that the electrically conductive layer is electrically coupled to the at least one plated-through hole. At least one further layer is electrodeposited onto the electrically conductive layer in the region of the at least one plated-through hole. The further layer comprises nickel. The electrically conductive layer is regionally removed outside the region of the at least one plated-through hole. The nickel-containing layer makes it possible to remove the electrically conductive layer regionally, wherein the former can serve as an etching mask. The nickel-containing layer permits the conductive layer to be patterned by means of less aggressive etching methods, wherein the ceramic itself is not attacked or is attacked to only a small extent. In the case of sensitive ceramics, etching stop layers that can be produced in a simple manner can be used during these etching methods.

In one embodiment, the electrically conductive layer remains in the region of the further layer during the regional removal. The further layer can be used as an etching mask during a selective etching of the electrically conductive layer.

By utilizing the further layer, which comprises nickel as an etching mask, it is possible for the electrically conductive layer to be removed regionally in such a way that the electrically conductive layer remains at the plated-through holes.

The conductive layer can comprise a metal that can be etched by means of an etchant comprising cyanide. An etchant comprising cyanide can then be used for regionally removing the electrically conductive layer.

The plated-through hole can electrically couple a first side and a second side of the ceramic layer. The first side of the ceramic layer lies opposite the second side. The ceramic layer can also be part of a multilayer construction. The plated-through hole can then also electrically couple to sides of the multilayer construction which lie opposite one another. The plated-through hole can also electrically couple individual layers of the multilayer construction to one another, for example, two layers arranged adjacent to one another within the multilayer construction.

In one embodiment, the method comprises applying a photoresist to the electrically conductive layer. At least one region of the photoresist is exposed. The region of the photoresist in which the electrically conductive layer is intended to be removed is exposed. The photoresist is developed. At least one non-exposed region of the photoresist is removed. The electrically conductive layer is thereby uncovered in the non-exposed region. The further layer is deposited onto the electrically conductive layer in the non-exposed region. The further layer is deposited onto the uncovered region of the electrically conductive layer.

However, it is also possible to use a photoresist that works positively, in the case of which the exposed region is removed and the unexposed region remains after development on the support.

As a result of the nickel-containing etching mask being formed by means of photopatterning, the etching mask can be formed with relatively fine structures. Accordingly, the electrically conductive layer can also be formed with relatively fine structures by means of the etching method. Relatively inexpensive materials can be used during the photopatterning. Inexpensive patterning or production of the carrier device is thus possible.

The electrically conductive layer is removed in the at least one exposed region. The opposite situation correspondingly prevails in the case of a positive resist. The method can comprise electroless application of a copper layer to the electrically conductive layer before the photoresist is applied. In a later method step, the copper layer can be regionally removed in the at least one exposed region.

In one embodiment, after the deposition of the at least one further layer, the at least one exposed region of the photoresist is removed, and the electrically conductive layer is thereby uncovered selectively in the exposed region, while the non-exposed region remains covered by the further layer. The opposite situation correspondingly prevails in the case of a positive resist.

In one embodiment, the method comprises applying at least one first layer to the ceramic layer before the electrically conductive layer is applied. The first layer can then be chosen such that it is resistant to etchant. The first layer is applied in such a way that it has a cutout in the region of the at least one plated-through hole. A further electrically conductive layer is applied to the ceramic layer in the region of the cutout of the first layer, such that the further electrically conductive layer is electrically coupled to the at least one plated-through hole.

In this embodiment, the electrically conductive layer is electrically coupled to the plated-through hole by the further electrically conductive layer. The first layer can be printed onto the ceramic layer. A material comprising glass can be applied during the application of the first layer. The electrically conductive layer and the further electrically conductive layer can comprise silver independently of one another.

At least one further copper layer can be electrodeposited in the region of the further layer. At least one in turn further conductive layer can be applied on the further layer. The in turn further conductive layer can cover at least the further layer and the electrically conductive layer.

A carrier device has a layer stack comprising at least one ceramic layer. The carrier device has at least one contact location having a layer composed of nickel. The carrier device can be designed to carry at least one electronic component.

In one exemplary embodiment, the carrier device comprises a further layer, which comprises glass. The further layer is arranged outside the at least one contact location on the ceramic layer.

In one embodiment, the carrier device comprises at least one further contact location. The at least one contact location and the at least one further contact location are at a distance from one another in a direction parallel to the layers of the layer stack of less than 100 micrometers. In one exemplary embodiment, the at least one contact location and the at least one further contact location are at a distance from one another of less than 80 micrometers.

An arrangement comprises such a carrier device and an electronic component, which is electrically and mechanically coupled to the at least one contact location of the carrier device. In one embodiment, the electronic component comprises a semiconductor component. However, the electronic component can also be a passive component, a MEMS component or a module, which can in turn carry electrical and/or electronic components arranged on a common substrate. The module can also comprise a complex circuit such as, in particular, filter circuits.

BRIEF DESCRIPTION OF THE DRAWINGS

Further advantages, features and developments will become apparent from the following examples explained in conjunction with FIGS. 1 to 16.

Elements that are identical, of identical type and act identically are provided with identical reference symbols in the figures.

The following list of reference symbols may be used in conjunction with the drawings:

100 Layer stack
101 Ceramic layer
102 Plated-through hole
103 Electrically conductive layer
104 Further layer
106 First side
107 Second side
108 Photoresist
109, 110 Region
111, 122 Glass layer
112, 123 Cutout
113, 116, 124 Electrically conductive layer
114, 115 Copper layer
117, 118 Contact location
119 Distance
120 Component
121 Carrier device
125 Photomask
126 Soldering connection

DETAILED DESCRIPTION OF ILLUSTRATIVE EMBODIMENTS

Figure 1:
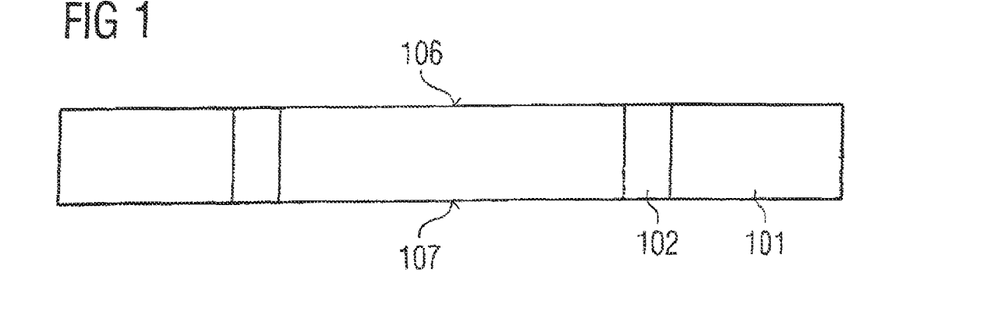
FIGS. 1 to 14 show a schematic illustration of a patterning of a ceramic layer in different steps of production.

FIG. 1 shows a ceramic layer 101, which has two plated-through holes 102. The ceramic layer 101 has, in its main extension direction, a first side 106 and a second side 107 lying opposite the first side.

The plated-through holes 102 are lead through the layer 101. The plated-through holes 102 electrically couple the first side 106 to the second side 107. The plated-through holes 102 comprise an electrically conductive material introduced in cutouts of the layer 101. The ceramic layer 101 can also have more than two plated-through holes, for example, four or more plated-through holes.

If the ceramic layer is part of a multilayer construction, the plated-through hole 102 can also electrically couple to sides of the multilayer construction that lie opposite one another. The plated-through hole 102 can also electrically couple individual layers of the multilayer construction to one another, for example, two layers arranged adjacent to one another within the multilayer construction.

In one embodiment, the ceramic layer 101 is a low temperature co-fired ceramic (LTCC). The layer 101 can comprise zinc oxide. In a further exemplary embodiment, the layer 101 comprises aluminum oxide and/or one or a plurality of glasses. In a further embodiment, the layer 101 comprises high temperature co-fired ceramic (HTCC). The layer can be stamped or perforated by means of a laser in order to be able to introduce the plated-through holes 102 into the layer.

Figure 2:
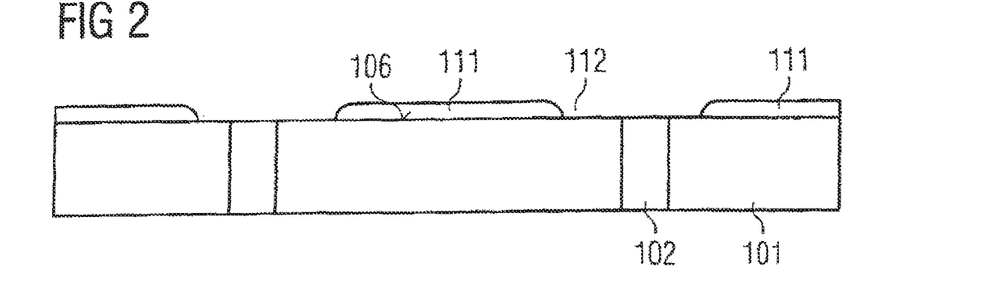

As shown in FIG. 2, as a first layer a glass layer 111 is applied to the side 106 of the layer 101. The glass layer 111 has in each case a cutout 112 in the region of the plated-through hole 102. The plated-through holes 102 are not covered by the glass layer 111 on the side 106. The glass layer can be applied to the layer 101 by means of a screen printing method, for example. The glass layer 111 protects the layer 101 in the course of the method described.

In a further embodiment, it is also possible to apply a layer comprising a further material that is suitable for protecting and passivating the ceramic layer 101 in the course of the following method.

Figure 3:
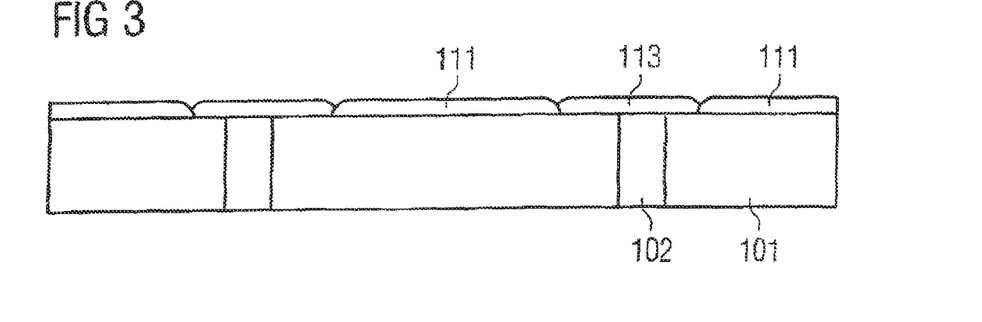

As shown in FIG. 3, in the cutouts 112 of the glass layer 111, an electrically conductive layer 113 is applied to the ceramic layer 101. By way of example, the electrically conductive layer 113 is introduced into the cutouts 112 of the layer 111 by means of a screen printing method. The electrically conductive layer 113 is applied to the first side 106 of the layer 101 in the region of the plated-through holes 102. The electrically conductive layer 113 touches the first side 106 of the layer 101. The electrically conductive layer 113 is electrically coupled to the plated-through hole 102. The electrically conductive layer 113 comprises silver, for example. The electrically conductive layer 113 realizes electrical contact with the plated-through hole 102 through the glass layer 111.

Figure 4:
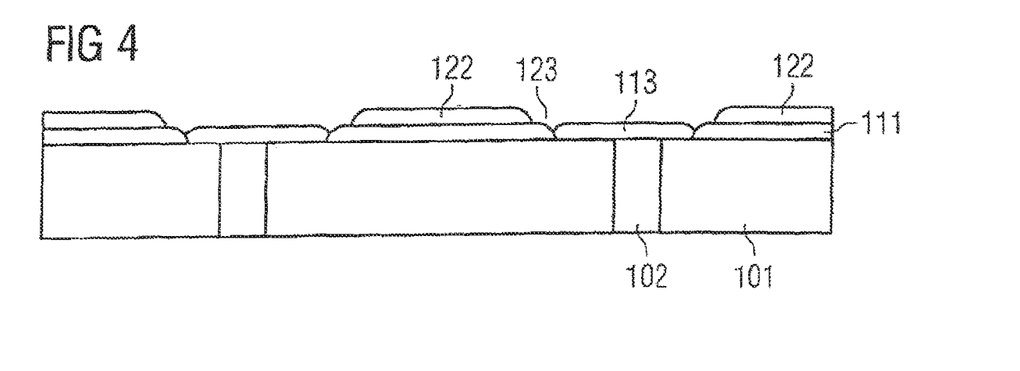

As shown in FIG. 4, a further glass layer 122 can be applied to the glass layer 111. The further glass layer 122 is applied to that side of the glass layer 111 which faces away from the layer 101. The glass layer 122 can be applied to the glass layer 111 by means of screen printing, like the glass layer 111. The glass layer 122 has a cutout 123 in the region of the plated-through hole 102 and respectively of the electrically conductive layer 113 and respectively of the cutout 112.

In a further exemplary embodiment, it is also possible to apply a layer comprising a different material from glass, which material is suitable for protecting and passivating the layer construction in the course of the method described.

Since the glass layers 111 and 122 can have air inclusions or other production-dictated inaccuracies, two glass layers for protecting and for passivating the ceramic layer 101 are applied to the first side 106 of the layer 101. This improves the protection of the ceramic layer 101 since possible inaccuracies of the layer 111 are covered by the layer 122.

Figure 5:
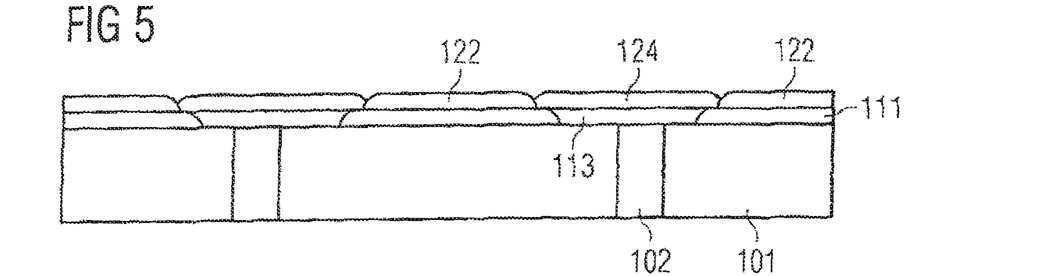

FIG. 5 shows that a further electrically conductive layer 124 has been introduced into the cutout 123 of the glass layer 122. The electrically conductive layer 124 can be introduced into the cutout 123 by means of screen printing, for example. The electrically conductive layer 124 is applied to that side of the electrically conductive layer 113 which faces away from the layer 101. The electrically conductive layer 124 is electrically coupled to the electrically conductive layer 113 and the plated-through hole 102. The electrically conductive layer 124 realizes electrical contact with the electrically conductive layer 113 and respectively with the plated-through hole 102 through the glass layer 122.

Figure 6:
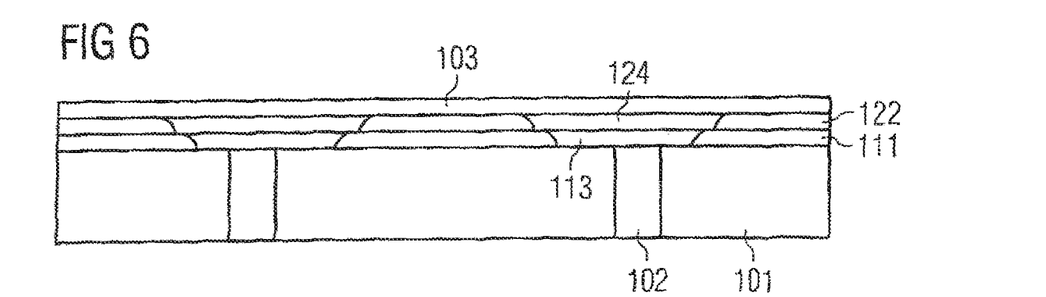

FIG. 6 shows that an electrically conductive layer 103 has been applied to the glass layer 122 and the electrically conductive layer 124. The electrically conductive layer 103 touches the glass layer 122 and the electrically conductive layer 124. The electrically conductive layer 103 extends over the layer 101 over the whole area. The electrically conductive layer 103 is electrically coupled to the electrically conductive layer 124, the electrically conductive layer 113 and the plated-through hole 102. The electrically conductive layer 103 comprises an electrically conductive material, for example, silver. The electrically conductive layer 103 comprises a material that can be etched by means of an etchant comprising cyanide.

In a further exemplary embodiment, the electrically conductive layer 103 is applied directly to the layer 101 and the plated-through holes 102, such that the electrically conductive layer 103 touches the first side 106 of the layer 101. This is the case if the material of the layer 101 does not have to be protected by a passivation layer like the layer 111 and the material of the layer 101 withstands the method described without significant damage or alterations of its functional properties.

In a further exemplary embodiment, the electrically conductive layer 103 is applied directly to the glass layer 111 and the electrically conductive layer 113, such that the electrically conductive layer 103 touches the glass layer 111 and the electrically conductive layer 113. This is the case, in particular, if the glass layer 111 was applied to the layer 101 with sufficiently high quality, such that the layer 101 is sufficiently protected by the glass layer 111.

The number of electrically conductive layers can also be determined depending on the amount of heat to be dissipated via the electrically conductive layers during operation. If more heat has to be dissipated, more than two, for example, three or more electrically conductive layers comparable to the electrically conductive layers 113 and 124, respectively can be arranged or produced one above another. If less heat has to be dissipated, the electrically conductive layer 113 together with the electrically conductive layer 103 can be sufficient and the electrically conductive layer 124 can be dispensed with.

Figure 7:
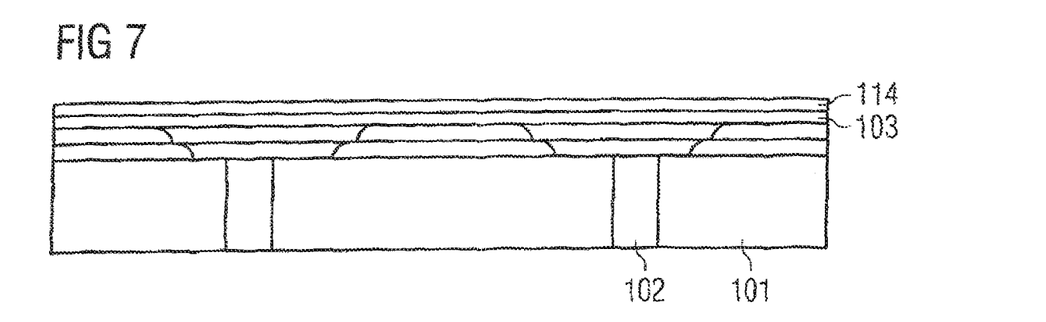

A copper layer 114 is applied in electroless fashion to that side of the electrically conductive layer 103 which faces away from the layer 101, as shown in FIG. 7.

Figure 8:
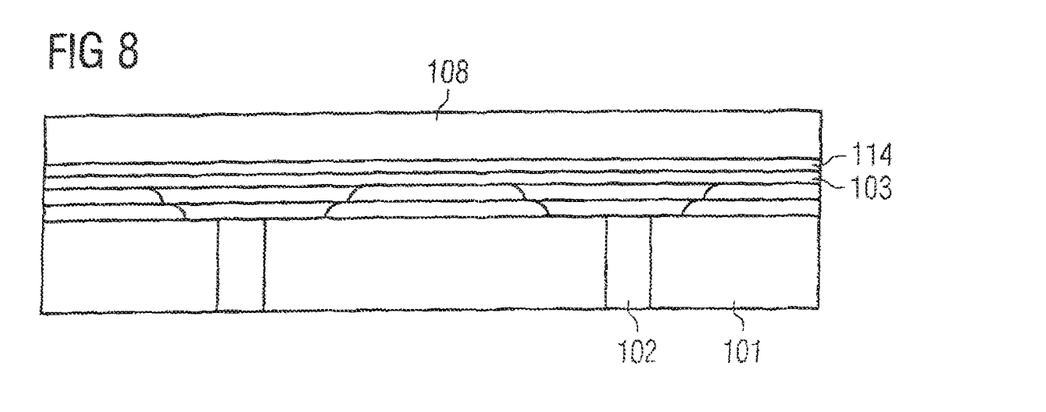

In FIG. 8, a photoresist 108 is applied to the copper layer 114. The copper layer 114 increases the adhesion of the photoresist on the layer sequence.

In a further exemplary embodiment, the photoresist 108 can also be applied to the electrically conductive layer 103, such that the photoresist 108 touches the electrically conductive layer 103 if the adhesion between the photoresist 108 and the electrically conductive layer 103 is high enough.

In particular, a negative photoresist is used, which polymerizes as a result of exposure, and the exposed regions remain after development.

In a further embodiment a positive photoresist can be used, in the case of which the already solid resist is made soluble again by exposure. Accordingly, only the regions which were protected by a mask before exposure remain after development.

Figure 9:
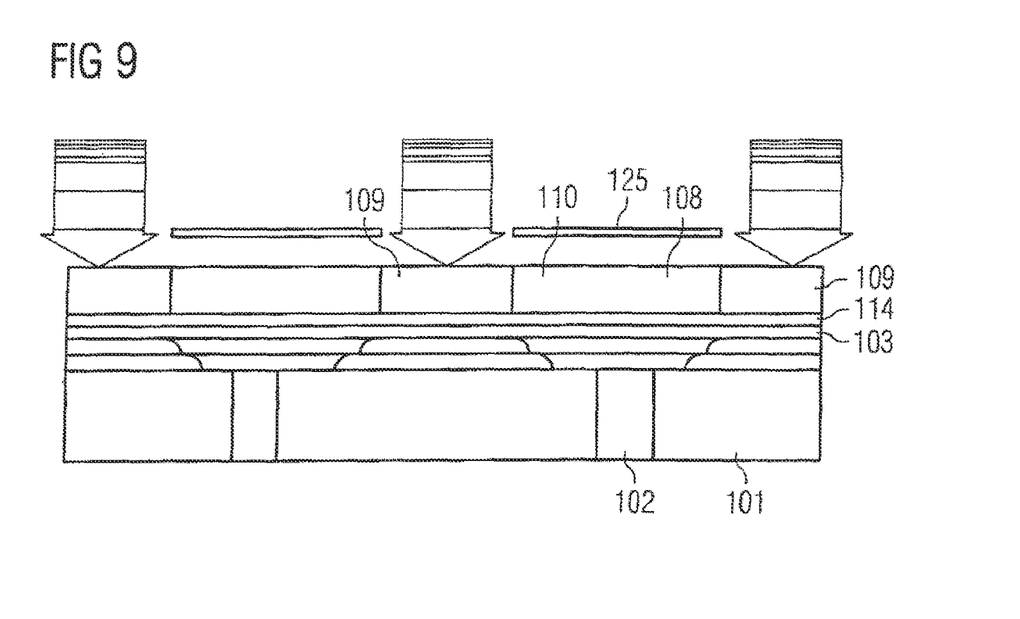

FIG. 9 illustrates the method step of exposing the photoresist 108. A photomask 125 is arranged above the photoresist 108 and the solubility of the photoresist is altered by a photochemical reaction in specific regions of the photoresist in which light passes into the photoresist 108. The photomask 125 is formed such that the photoresist 108 is not exposed in a manner corresponding to the structures to be produced. In the exemplary embodiment shown, the regions 110 lying above the plated-through holes 102 are not exposed. Regions 109 lie between the plated-through holes 102. The cutouts of the photomask 125, through which light passes to the photoresist 108, have, for example, a width of less than 100 micrometers, in particular a width of less than 80 micrometers. A width of less than 25 microns can also be patterned. However, the photoresist can also be exposed in scanning fashion.

The photoresist 108 is exposed at the locations at which it is not intended to be removed in the subsequent method step. The photoresist 108 is thereby developed. In particular, in the case of corresponding photoresists, it is possible to dispense with an organic solvent as developer.

Figure 10:
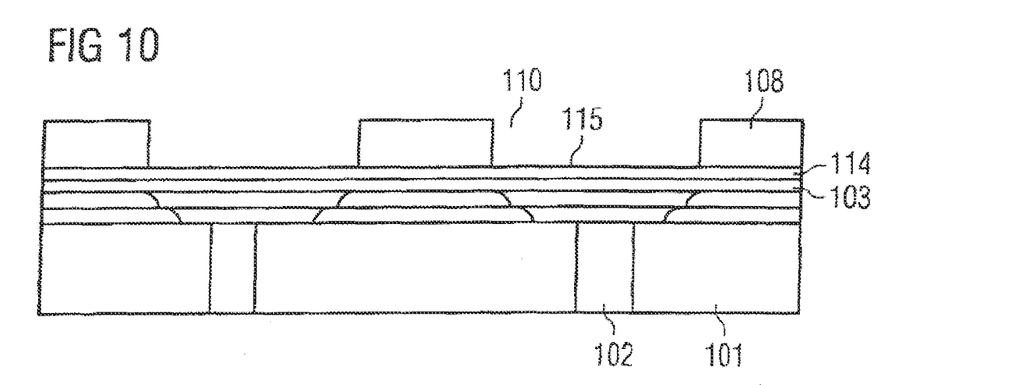

FIG. 10 shows the photoresist 108 on the layer sequence after development. In the region 110, the photoresist has been removed from the copper layer 114. No photoresist is arranged in the region 110 above the plated-through holes 102 and the electrically conductive layer 113 and the electrically conductive layer 124. The layer 103 is uncovered in the region 110.

Figure 11:
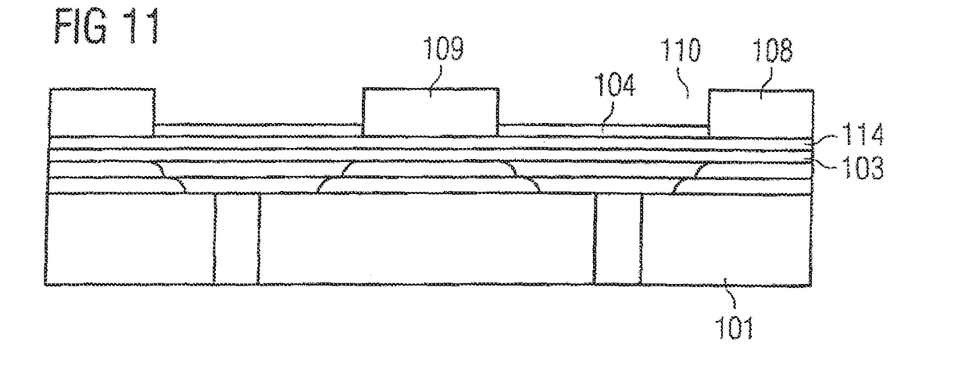

As shown in FIG. 11, nickel is applied to the copper layer 114 electrolytically into the regions 110 freed of the photoresist 108. In a further embodiment, nickel is applied to the copper layer 114 chemically into the regions 110 freed of the photoresist 108. A layer 104 comprising the nickel touches the copper layer 114. The deposition of the nickel layer on that side of the copper layer 114 which faces away from the layer 101 is laterally delimited by the remaining regions 109 of the photoresist 108.

Copper 115 can additionally be electrodeposited into the regions 110. The copper layer 115 can be applied before the deposition of the nickel layer, for example, in order to be able to deposit the nickel more uniformly. Moreover, the thermal conductivity of the layers can be increased by means of the copper layer 115. The thickness of the electrodeposited copper can be set depending on how much heat is intended to be dissipated via the layer stack. If more heat is intended to be dissipated, the copper layer 115 is deposited with a greater thickness. If less heat is intended to be dissipated, the copper layer 115 is deposited more thinly.

Figure 12:
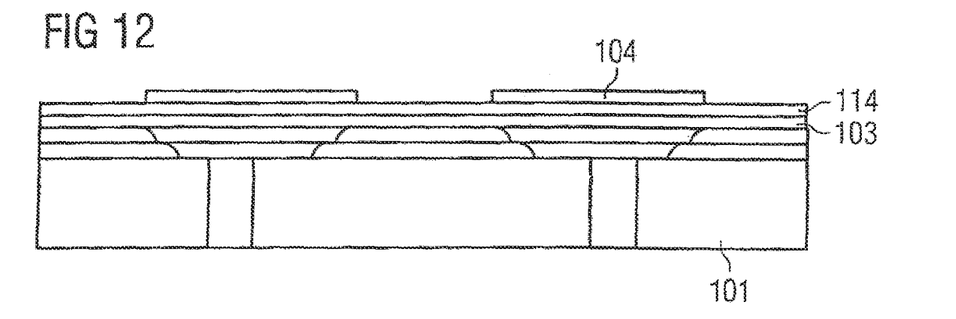

After the remaining regions 109 of the photoresist 108 have been removed from the layer sequence, as shown in FIG. 12, an etching mask is applied to the layer sequence through the nickel layer 104. With the aid of an etchant, for example, a solution of a cyanide, in particular potassium cyanide KCN, the copper layer 114 and the electrically conductive layer 103 can be partly removed. The etchant comprises, in particular, an alkaline, aqueous solution that is designed to dissolve silver and/or copper.

Figure 13:
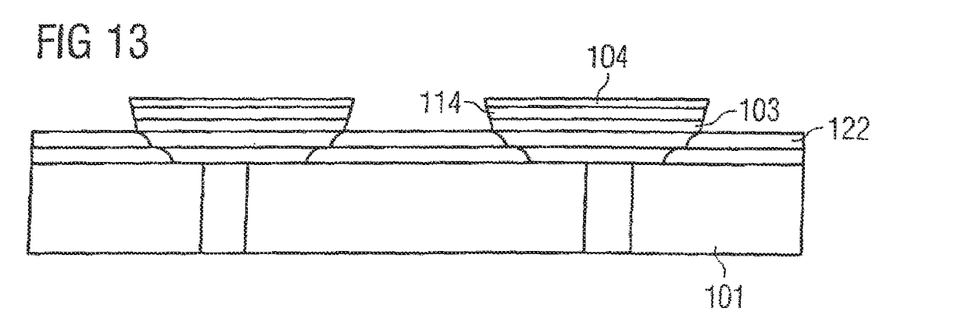

In the region of the nickel layer 104, which is more resistant to the etchant used than the copper layer 114 and the electrically conductive layer 103, the copper layer 114 and the electrically conductive layer 103 remain, as shown in FIG. 13. The copper layer 114 and the electrically conductive layer 103 remain since the nickel layer 104 is not attacked by the etchant and protects the layers arranged beneath the nickel layer 104. In the regions in which the nickel layer 104 is arranged, in particular in the regions of the plated-through holes 102, the remaining regions of the electrically conductive layer 103 and of the copper layer 114 are also arranged.

After the selective etching, the glass layer 122 is uncovered in the region in which no nickel layer 104 was arranged, the glass layer not being removed by the etchant. In the regions that are free of nickel, the layers 114 and 103 above the glass layer 122 have been removed. The glass layer 122 and respectively the glass layer 111 protect the ceramic layer 101 against the etchant. The glass layer 122 and respectively the glass layer 111 serve as an etching stop in order that the ceramic layer 101 is not damaged by the etchant.

Figure 14:
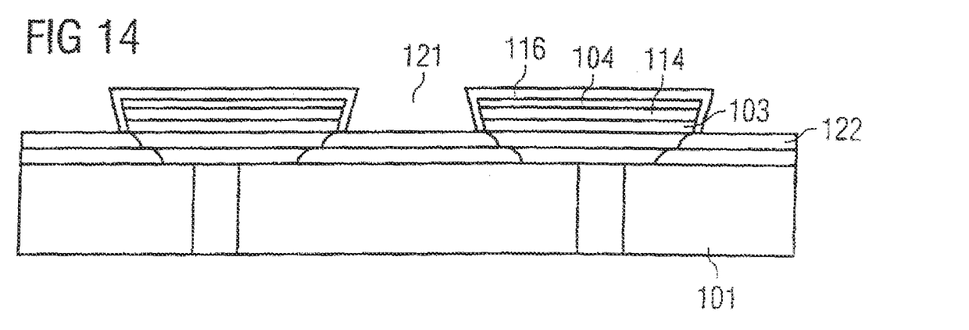

As shown in FIG. 14, the remaining regions of the layers 103, 114 and 104 that are uncovered at the edges can be covered by a further electrically conductive layer 116. The electrically conductive layer 116 comprises, for example, gold and/or a further electrically conductive material.

FIG. 14 shows a carrier device 121 before components are mounted thereon. The glass layers 122 and respectively 111 protect the ceramic layer 101 during the etching process described, in which the electrically conductive layer 103 and the copper layer 104 are partly removed, as in the transition from FIG. 12 to FIG. 13.

Figure 15:
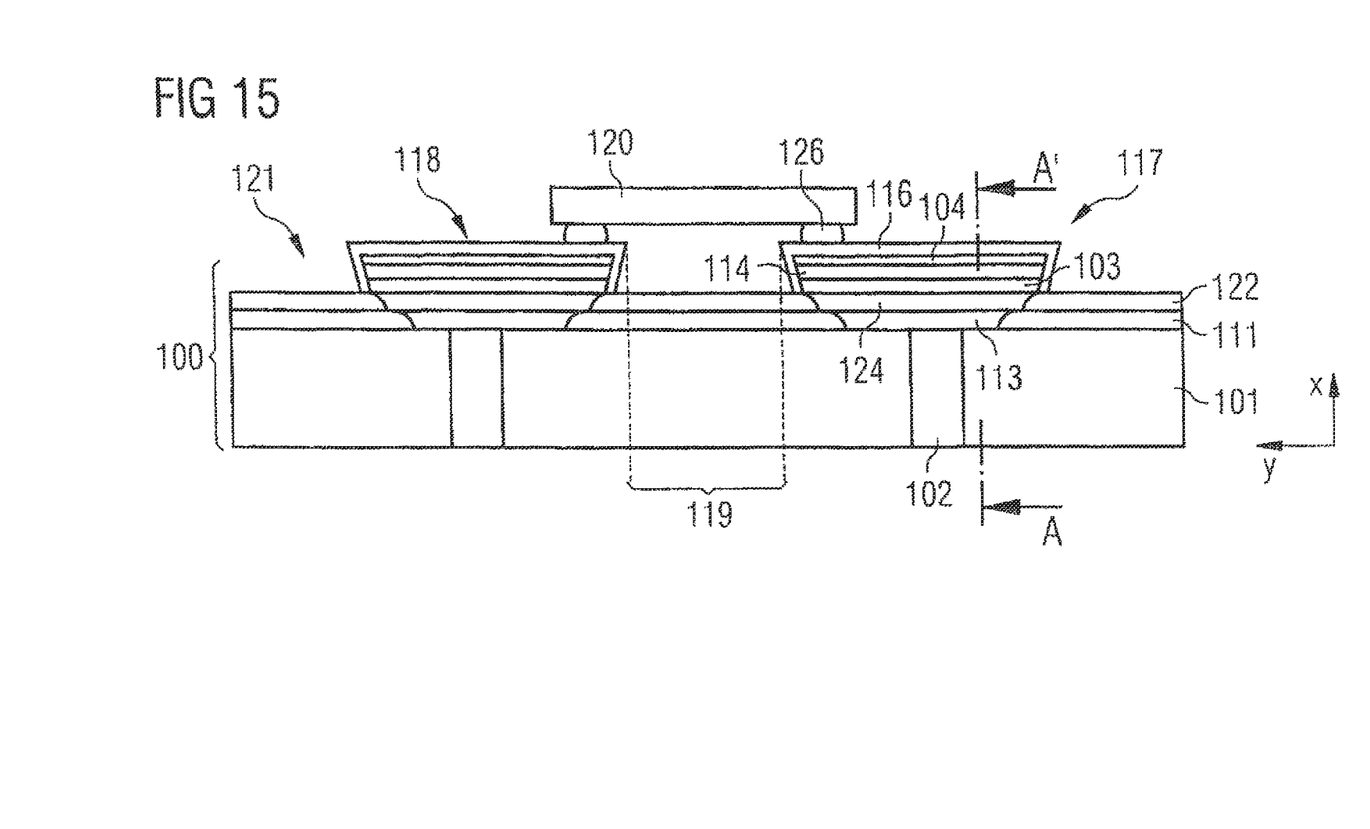
FIG. 15 shows a schematic illustration of an arrangement comprising a ceramic carrier device in accordance with one embodiment.

FIG. 15 shows the carrier device 121 after at least one component has been mounted thereon. The carrier device 121 comprises a layer stack 100 having the following order of layers in the x-direction along the line A-A'.

The construction of the exemplary layer stack 100 begins with the ceramic layer 101 having the plated-through holes 102. On the ceramic layer 101, the glass layer 111 is arranged and the electrically conductive layer 113 is arranged in the cutouts 112 of the glass layer 111. Afterwards, the further glass layer 122 is arranged on the glass layer 111. On the electrically conductive layer 113, the electrically conductive layer 124 is arranged in the cutouts 123 of the glass layer 122. The electrically conductive layer 103 is arranged on the electrically conductive layer 124. The copper layer 114 is arranged on the electrically conductive layer 103. The nickel layer 104 is arranged on the copper layer 114. The copper layer 114 can be arranged between the copper layer and the nickel layer 104. Arranged on the nickel layer 104 is a palladium layer and on the latter the gold layer 116. The gold layer 116 also covers the lateral flanks of the layers 104, 114 and 103. The palladium layer can be applied to the other layers in electroless fashion.

Solderable contact locations 117 and 118 are formed by this layer stack. The contact locations are also suitable for wiring and/or as contact locations for adhesive bonding, flip-chip bonding, thermocompression bonding, wire bonding (aluminum wire bonding, gold wire bonding, Cu wire bonding, platinum wire bonding). The contact locations are designed to be processed by means of further construction methods and/or coupling methods. An electronic component 120 is coupled to the contact locations 117 and 118 via soldering connections 126. The contact location 117 is arranged at a distance 119 in the y-direction from the contact location 118. By virtue of the fact that the contact locations 117 and 118 were produced by subtractive etching, as described in conjunction with FIGS. 1 to 14, the distance 119 can be made relatively small. In particular, the distance 119 can be less than 120 micrometers, in particular less than 100 micrometers. By way of example, the distance 119 is less than 80 micrometers, in particular less than 60 micrometers. A distance 119 of greater than 120 micrometers can also be formed, of course, by means of the method described. The carrier device 121 can be formed simultaneously with particularly finely and less finely patterned contact locations or interspaces between contact locations particularly well by means of the production method described.

The electronic component 120 comprises, in particular, an integrated semiconductor component. By way of example, the electronic component 120 comprises a photoelectric component, in particular a light-emitting diode. The component 120 can comprise, in particular, semiconductor circuits that generate a great deal of heat, such as amplifier circuits, for example. Passive components or components with microelectromechanical systems (MEMS components) are also suitable. The heat of the electronic component 120 that occurs during operation can be dissipated well via the layer stack 100.

Figure 16:
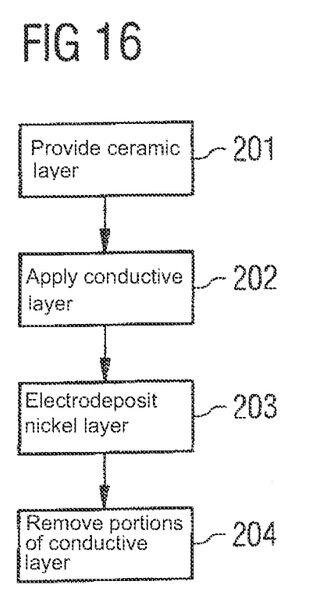
FIG. 16 shows a flowchart of a method for patterning a ceramic layer in accordance with one embodiment.

FIG. 16 shows a flow chart of a method for producing or patterning a layer construction comprising a ceramic layer, for example, a carrier device. In a first method step 201, the ceramic layer 101 is provided, which comprises the at least one plated-through hole 102. Afterwards, in a step 202, the electrically conductive layer 103, in particular silver, is applied to the ceramic layer 101. Afterwards, in a step 203, the nickel layer 104 is electrodeposited onto the electrically conductive layer 103. Afterwards, in a step 204, the electrically conductive layer 103 is removed outside the region of the plated-through hole 102, such that the electrically conductive layer 103 remains in the region of the at least one plated-through hole 102.

Before step 203, the photoresist can be applied to the electrically conductive layer 103 and serve as an application mask for the nickel layer 104 by means of exposure and development. In step 204, the electrically conductive layer 103, comprising silver, for example, is patterned with the aid of the nickel layer 104, which is used as an etching mask, by means of an etchant comprising cyanide, for example.

The method described makes it possible to dispense with photopatterning with one or more polyimide layers coated with chromium and/or copper by means of a sputtering process. In particular, the use of the glass layers makes it possible to dispense with passivation by polyimide. Moreover, it is possible to dispense with organic solvents as a developer for the photoresist.

The invention claimed is:

1. A method for patterning a layer stack, the method comprising:
    providing a ceramic layer, which comprises at least one plated-through hole;
    applying an electrically conductive layer over the ceramic layer, such that the electrically conductive layer is electrically coupled to the at least one plated-through hole;
    electrolessly applying a copper layer to the electrically conductive layer, wherein the electrolessly applying the copper layer applies the copper layer laminar;
    applying a photoresist to the electrically conductive layer after the electrolessly applying the copper layer;
    exposing a region of the photoresist in which the electrically conductive layer is intended to be removed;

removing a non-exposed region of the photoresist, thereby uncovering the electrically conductive layer in the non-exposed region;

electrodepositing a further layer onto the electrically conductive layer in the non-exposed region and in a region of the at least one plated-through hole, wherein the further layer comprises nickel;

removing the electrically conductive layer outside the region of the at least one plated-through hole; and applying a further conductive layer on the further layer, wherein the further conductive layer at least covers the further layer and the electrically conductive layer and also covers lateral flanks of the further layer and the electrically conductive layer.

2. The method according to claim 1, wherein the electrically conductive layer remains in a region of the further layer during the removal.

3. The method according to claim 1, wherein the further layer is used as an etching mask during a selective etching of the electrically conductive layer.

4. The method according to claim 1, wherein the electrically conductive layer comprises a metal that can be etched by an etchant comprising cyanide, and wherein an etchant comprising cyanide is used for removing the electrically conductive layer.

5. The method according to claim 1, wherein the plated-through hole electrically couples a first side of the ceramic layer and a second side lying opposite the first side.

6. The method according to claim 1, wherein the electrically conductive layer is removed in the exposed region.

7. The method according to claim 1, wherein the copper layer is removed in the exposed region.

8. The method according to claim 1, wherein, depositing the at least one further layer, the exposed region of the photoresist is removed and the electrically conductive layer is thereby uncovered in the exposed region.

9. The method according to claim 1, comprising:
applying a first layer to the ceramic layer before the electrically conductive layer is applied, wherein the first layer is resistant to an etchant and wherein the first layer has a cutout in the region of the at least one plated-through hole; and applying a further electrically conductive layer to the ceramic layer in the region of the cutout of the first layer, such that the further electrically conductive layer is electrically coupled to the at least one plated-through hole.

10. The method according to claim 9, wherein applying the first layer comprises printing.

11. The method according to claim 9, wherein applying the first layer comprises applying a material comprising glass.

12. The method according to claim 1, wherein the electrically conductive layer comprises silver.

13. The method according to claim 1, comprising:
electrodepositing at least one further copper layer in a region of the further layer.

* * * * *